United States Patent [19]
Kato et al.

[11] Patent Number: 5,060,178
[45] Date of Patent: Oct. 22, 1991

[54] SYSTEM FOR ANALOG-DIGITAL-ANALOG CONVERSION

[75] Inventors: Hisao Kato; Yasushi Adachi, both of Itami, Japan

[73] Assignee: Mitsubishi Denki Kabushiki Kaisha, Tokyo, Japan

[21] Appl. No.: 380,025

[22] Filed: Jul. 14, 1989

[30] Foreign Application Priority Data

Dec. 27, 1988 [JP] Japan .............................. 63-331391

[51] Int. Cl.$^5$ .............................................. G06J 7/12
[52] U.S. Cl. ..................................... 364/600; 341/110
[58] Field of Search ............... 341/110, 143, 154, 108, 341/144, 139; 340/347; 375/28; 364/600, 602; 358/160

[56] References Cited

U.S. PATENT DOCUMENTS

| | | | |
|---|---|---|---|
| 4,087,754 | 5/1978 | Song | 340/347 |
| 4,355,304 | 10/1982 | Kasuga et al. | 340/347 DA |
| 4,542,369 | 9/1985 | Kasuga | 340/347 DA |
| 4,811,019 | 3/1989 | Julstrom et al. | 341/143 |
| 4,811,097 | 3/1989 | Ritter et al. | 358/160 |
| 4,839,923 | 6/1989 | Kotzin | 341/143 |
| 4,843,391 | 6/1989 | Lernout | 341/143 |
| 4,851,842 | 7/1989 | Iwamatsu | 341/139 |
| 4,901,077 | 2/1990 | Christopher | 341/143 |
| 4,931,796 | 6/1990 | Hasegawa et al. | 341/154 |
| 5,001,480 | 3/1991 | Ferry et al. | 341/108 |

*Primary Examiner*—Jerry Smith
*Assistant Examiner*—Jim Trammell
*Attorney, Agent, or Firm*—Oblon, Spivak, McClelland, Maier & Neustadt

[57] ABSTRACT

Control circuit, which is connected to a data processor, a D-A converter, such as a current integration type adaptive delta demodulator, and a data processing mode change command terminal, attenuates output from the data processor in response to a data processing mode change command from the data processing mode change command terminal while delaying the data processing mode change command by a first prescribed time to supply the command to the D-A converter and releasing the attenuation of the output of the data processor after a lapse of a second prescribed time which is longer than the first prescribed time. Thus, no instable output data from the data processor appear at the output of the D-A converter so that no noise is caused.

13 Claims, 9 Drawing Sheets

SYSTEM FOR ANALOG-DIGITAL-ANALOG CONVERSION

BACKGROUND OF THE INVENTION

1. Field of the Invention

The present invention relates to a signal processing apparatus, and more particularly, it relates to a signal processing apparatus which receives an analog signal to convert the same into a digital signal and processes the digital signal to re-convert the processed digital signal into an analog signal, to thereby output the same.

2. Description of the Background Art

Figure 1A:
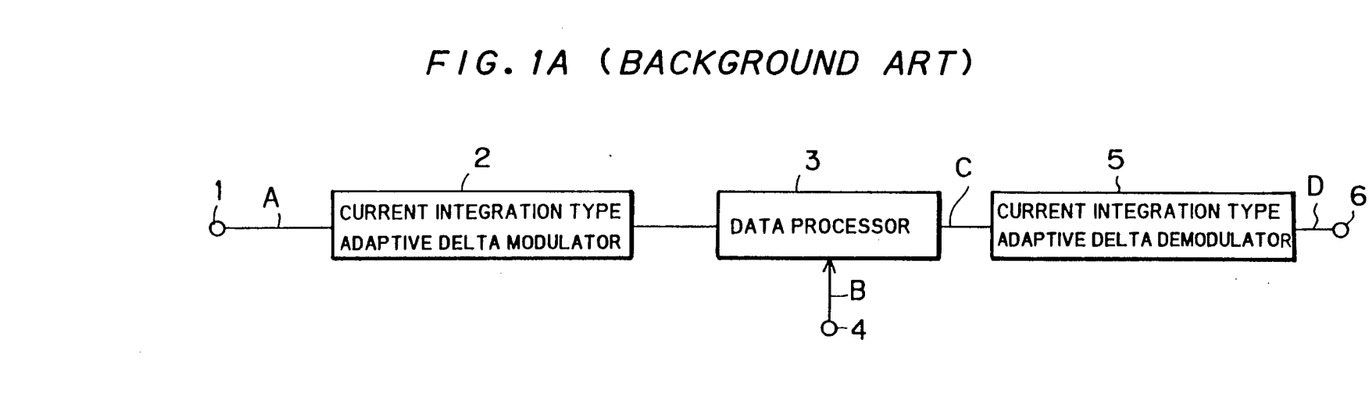
FIG. 1A is a block diagram showing a conventional signal processing apparatus.
Figure 1B:
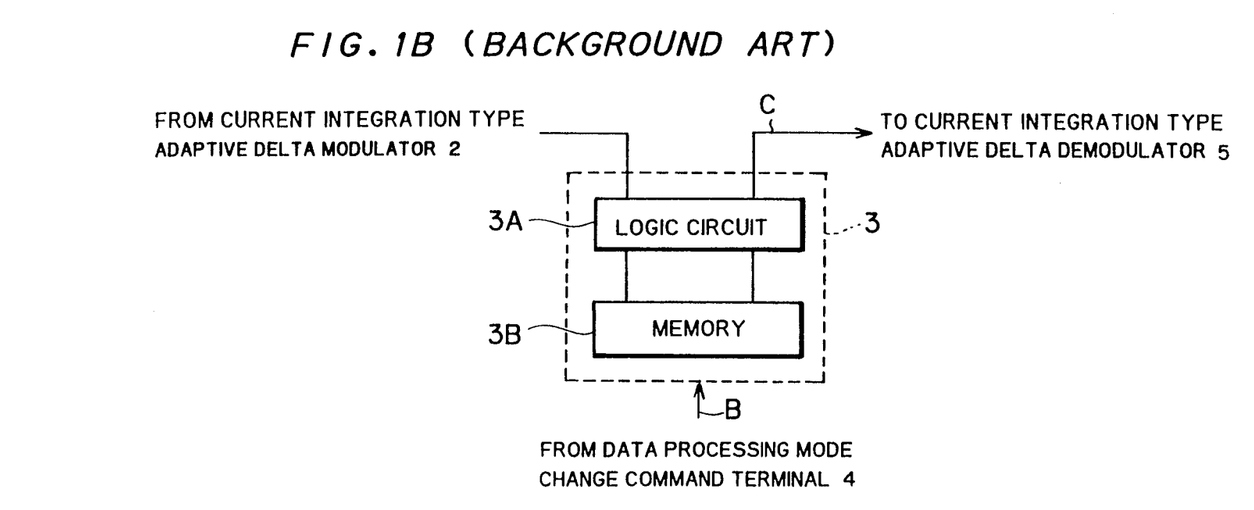
FIG. 1B is a block diagram showing structure of a data processor.

FIG. 1A is a block diagram showing a conventional signal processing apparatus which is formed by current integration type adaptive delta modulators and a data processor. This signal processing apparatus serves as an analog delay system, which can be employed for processing a sound signal such as an echo signal. An analog sound signal is inputted in an analog signal input terminal 1. A current integration type adaptive delta modulator 2 modulates the analog signal received in the analog signal input terminal 1 into a digital signal. A data processor 3 is supplied with the digital signal from the current integration type adaptive delta modulator 2, to perform delay processing for echo on the digital signal and output the same. As shown in FIG. 1B, the data processor 3 is formed by a logic circuit 3A and a memory 3B. A data processing mode change command is supplied to the data processor 3 through a data processing mode change command terminal 4. When the data processing mode change command is supplied, a working area of the memory 3B included in the data processor 3 is changed. A current integration type adaptive delta demodulator 5 demodulates the digital signal, which is subjected to the delay processing for echo, into an analog signal. The analog signal outputted from the current integration type adaptive delta demodulator 5 is extracted from an analog signal output terminal 6.

Figure 2:
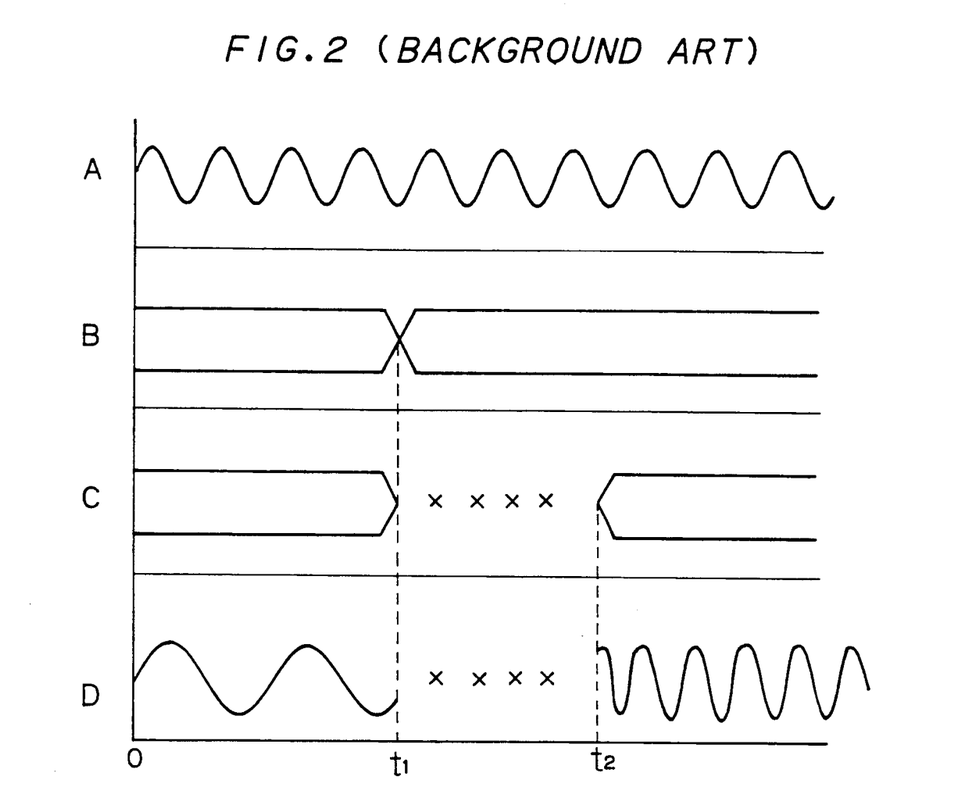
FIG. 2 and FIG. 3 are diagrams illustrative of operation of the apparatus shown in FIG. 1A.
Figure 3:
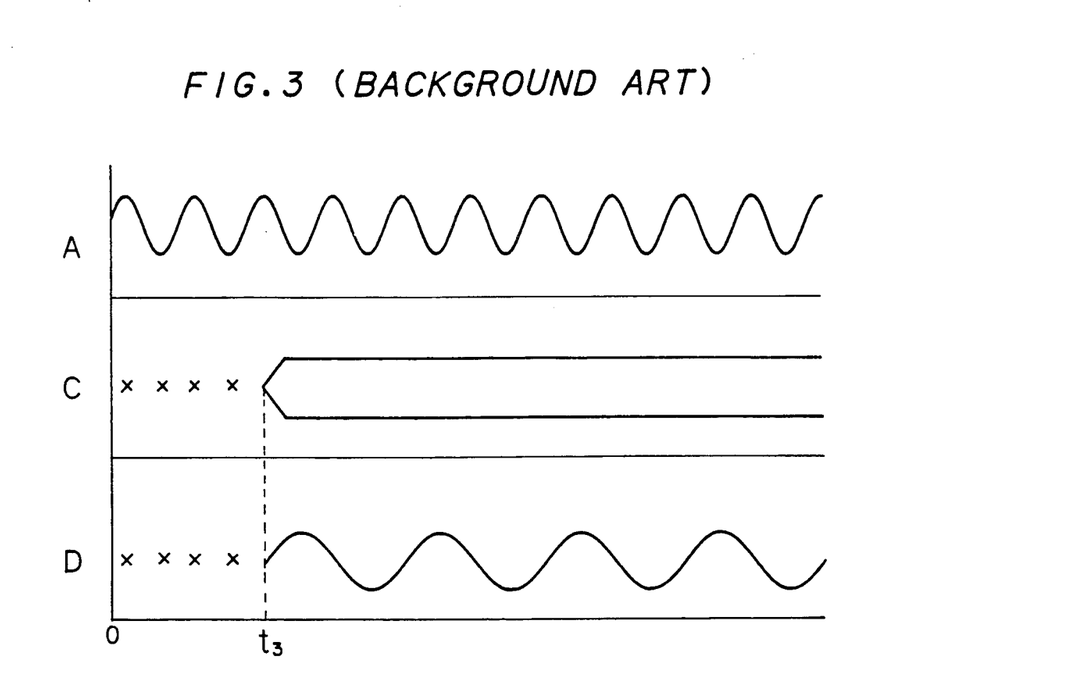

FIG. 2 illustrates waveforms of respective signals in normal operation, and FIG. 3 illustrates waveforms of the respective signals in an initial state upon power supply.

With reference to FIG. 2, operation in a normal state will now be described. It is assumed here that an analog signal A shown in FIG. 2 is inputted in the analog signal input terminal 1. This analog signal A is modulated into a digital signal by the current integration type adaptive delta modulator 2, to be supplied to the data processor 3. The data processor 3 employs a constant area of the memory 3B to repeat reading and writing of data in a FIFO system through the logic circuit 3A. A delay time is decided depending on the working area of the memory 3B. Thus, the digital signal is subjected to delay processing for echo. The current integration type adaptive delta demodulator 5 demodulates a digital signal C thus subjected to delay processing into an analog signal D, to output the same from the analog signal output terminal 6. It is assumed here that a data processing mode change command B is inputted from the data processing mode change command terminal 4 to the data processor 3 at a time t1. In response to this, the data processing mode of the data processor 3 is changed. It is assumed that the working area of the memory 3B included in the data processor 3 is expanded as the data processing mode changes, for example. Immediately upon supply of the data processing mode change command B, data are read at random since no correct data are written in the expanded working area of the memory 3B. A constant time is required to thereafter write/read correct data in/from the working area. In other words, output data C of the data processor 3 are instable during an interval between times t1 and t2 shown in FIG. 2. In the interval between the times t1 and t2, the instable data C are demodulated by the current integration type adaptive delta demodulator 5 into the analog signal D, to be outputted from the analog signal output terminal. Thus, an abnormal analog signal D is outputted in the interval between the times t1 and t2, to cause noise etc. After the data C are stabilized at the time t2, a normal analog signal D is outputted from the analog signal output terminal 6.

Operation in an initial state upon power supply will now be described with reference to FIG. 3. Also in the initial state upon power supply, no correct data are written in the working area of the memory 3B, similarly to the above. Thus, a lapse of a constant interval (from time 0 to time t3) is required for writing and reading correct data. Also in the initial state, instable data C are converted into the analog signal D by the current integration type adaptive delta demodulator 5 in the interval between the times 0 and t3, to be outputted. Thus, an abnormal analog signal D is outputted in the interval between the times 0 and t3, to cause noise etc. After the data C are stabilized at the time t3, a normal analog signal D is outputted.

In the conventional signal processing apparatus of the aforementioned structure, the current integration type adaptive delta demodulator 5 converts the insufficiently stabilized data C into the analog signal D to output the same, whereby noise or the like is caused by such an abnormal analog signal. A similar problem is caused also in an initial state upon power supply, since the current integration type adaptive delta demodulator 5 converts the insufficiently stabilized data into the analog signal D to output the same also in this case.

SUMMARY OF THE INVENTION

The present invention is directed to a signal processing apparatus for receiving a first analog signal to convert the first analog signal into a digital signal, performing prescribed processing on the digital signal and re-converting the digital signal as processed into a second analog signal to output the second analog signal. A signal processing apparatus according to the present invention comprises an input terminal for receiving the first analog signal, an A-D converter connected to the input terminal for converting the first analog signal into a digital signal, a data processor connected to the A-D converter for performing prescribed processing on the digital signal from the A-D converter in a designated processing mode within a plurality of data processing modes to output a processed digital signal, a D-A converter for receiving the processed digital signal from the data processor to convert the processed digital signal into the second analog signal, a data processing mode change command terminal for receiving a data processing mode change command for changing the data processing mode of the data processor, and control means connected to the data processor, the D-A converter and the data processing mode change command terminal for attenuating the second analog signal in response to the data processing mode change command from the data processing mode change command terminal while delaying the data processing mode change command by a first prescribed time to supply the command to the data processor and releasing attenuation of the second analog signal after a lapse of a second prescribed time being longer than the first prescribed time.

According to the present invention, there is provided control means for attenuating a second analog signal to be outputted in response to a data processing mode change command from a data processing mode change command terminal while delaying the data processing mode change command by a first prescribed time to supply the command to data processor and releasing attenuation of the second analog signal after a lapse of a second prescribed time which is longer than the first prescribed time, whereby the processing mode of the data processor can be changed after complete attenuation of the second analog signal to be outputted so that the second analog signal is completely attenuated during an interval when the output data of the data processor are instable.

Accordingly, an object of the present invention is to obtain a signal processing apparatus which causes no noise in change of a data processing mode and upon power supply.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 4:
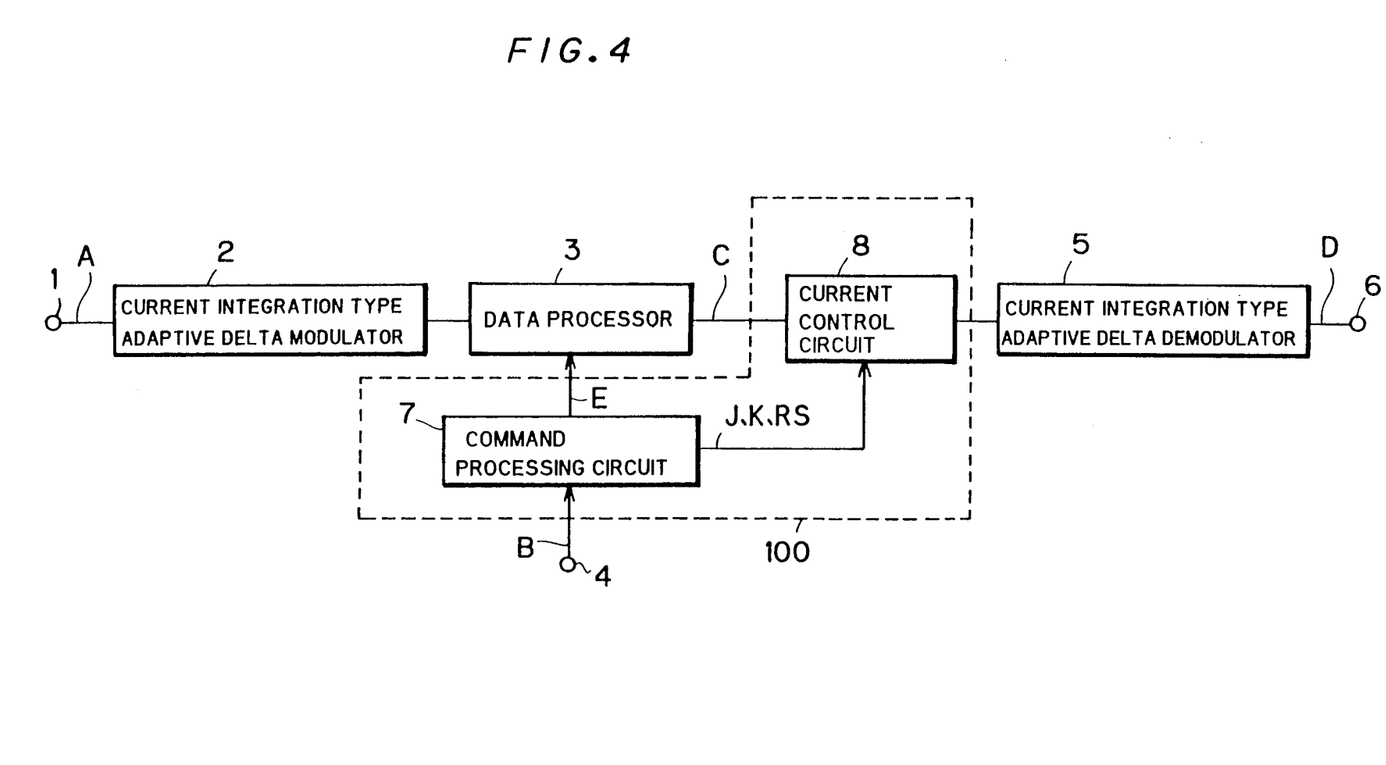
FIG. 4 is a block diagram showing an embodiment of a signal processing apparatus according to the present invention.

FIG. 4 is a block diagram showing an embodiment of a signal processing apparatus according to the present invention. Referring to FIG. 4, the inventive circuit is different from the conventional circuit shown in FIG. 1A in provision of a control circuit 100, which is formed by a command processing circuit 7 for performing prescribed processing on a data processing mode change command supplied from a data processing mode change command terminal 4 as hereinafter described and a current control circuit 8 for controlling the amount of current inputted in a current integration type adaptive delta demodulator 5. This control circuit 100 is connected to the data processing mode change command terminal 4, a data processor 3 and the current integration type adaptive delta demodulator 5.

Figure 5:
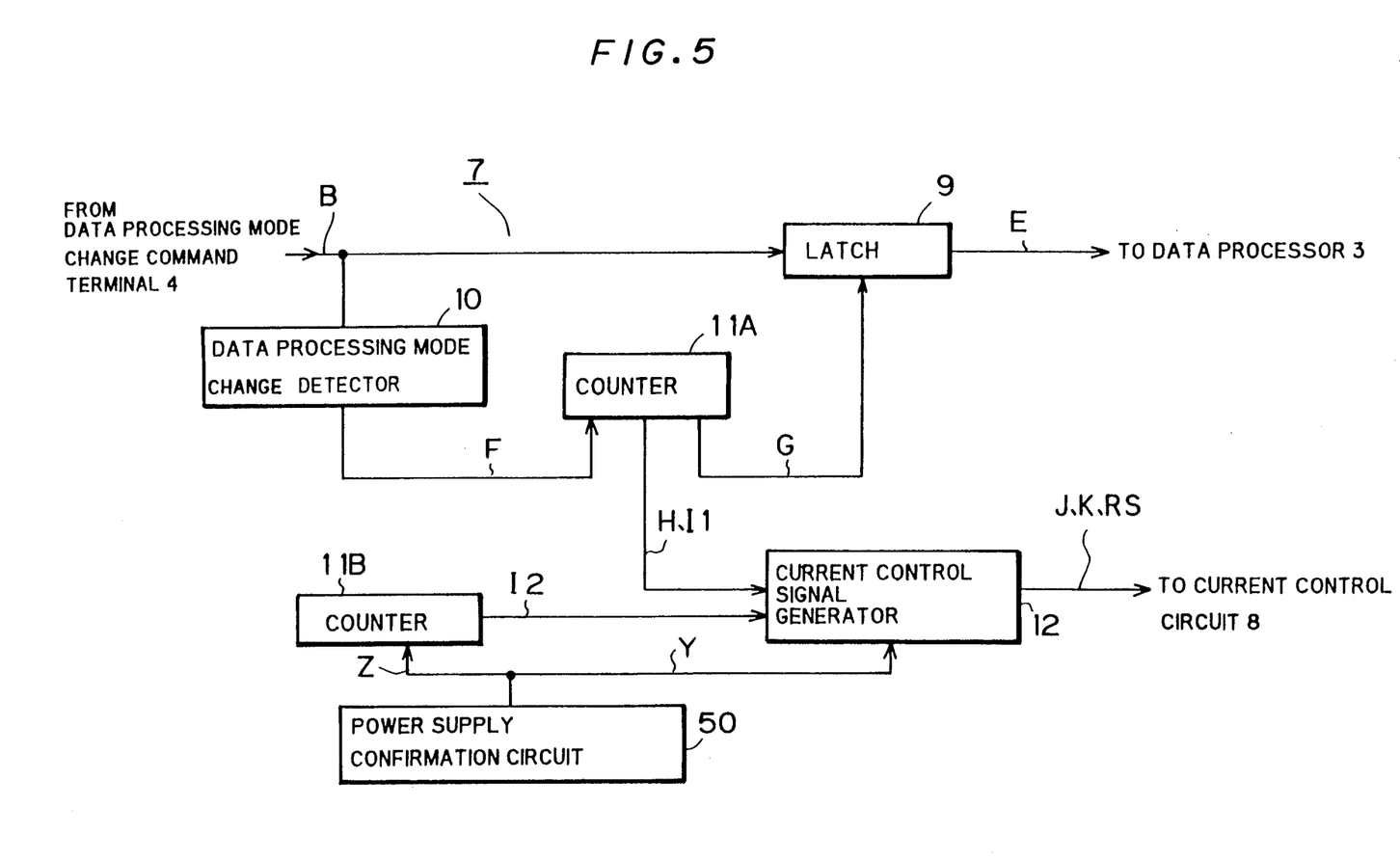
FIG. 5 is a block diagram showing exemplary structure of a command processing circuit.

FIG. 5 is a block diagram showing exemplary structure of the command processing circuit 7. A latch 9 is adapted to latch a data processing mode change command supplied from the data processing mode change command terminal 4. A data processing mode change detector 10, which is formed by a shift register, detects change of the data processing mode to supply a change signal F to a counter 11A. The counter 11A starts counting in response to the change signal F, to supply a latch release signal G to the latch 9 upon counting by a first number. The latch 9 is released from its latch state in response to the latch release signal G, to supply a data processing mode change command E to the data processor 3. The counter 11A further supplies a signal H to a current control signal generator 12 in response to the change signal F, while starting counting in response to the change signal F to supply a signal I1 to the current control signal generator 12 upon counting by a second number. The counter 11A is reset upon such counting by the second number. In response to the signal H, the current control signal generator 12 supplies an attenuation start signal J to the current control circuit 8. In response to the attenuation start signal J, the current control circuit 8 attenuates output current (i.e., attenuation mode). On the other hand, the current control signal generator 12 supplies an attenuation release signal K to the current control circuit 8 in response to the signal I1. The current control circuit 8 stops attenuation of the output current (i.e., non-attenuation mode) in response to the attenuation release signal K.

A power supply confirmation circuit 50 supplies a signal Y to the current control signal generator 12 before power supply. In response to the signal Y, the current control signal generator 12 supplies a reset signal RS to the current control circuit 8.

Figure 10:
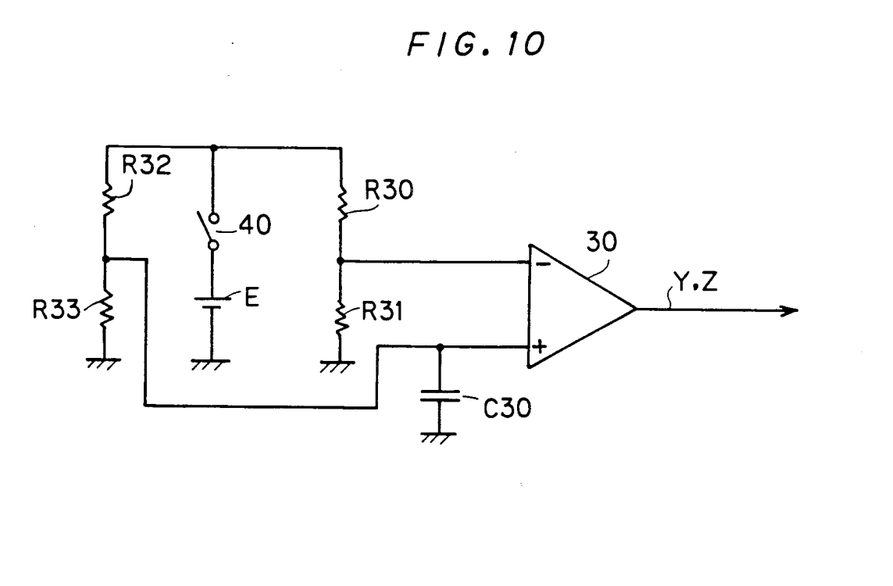
FIG. 10 is a circuit diagram showing exemplary structure of the power supply confirmation circuit 50.

The power supply confirmation circuit 50 supplies a making signal Z to a counter 11B when a power is supplied. The counter 11B starts counting in response to the making signal Z, to supply a signal I2 to the current control signal generator 12 upon counting by a third number. In response to the signal I2, the current control signal generator 12 supplies an attenuation release signal K to the current control circuit 8. The counter 11B is reset upon counting by the third number. FIG. 10 is a circuit diagram showing exemplary structure of a power supply confirmation circuit 50. Positive input of a comparator 30 is grounded through a capacitor 30, whereas negative input is connected to an interconnected point of resistors R30 and R31. The resistors R30 and R31 determine a threshold potential of the comparator 30. The positive input of the comparator 30 is further connected to the point where resistors R32 and R33 are connected to each other. The resistors R32 and R33 determine a saturation potential of the positive input of the comparator 30. A switch 40 and a power source E are connected in series between a ground and the interconnected point of the resistors R30 and R32. A signal y is outputted when the potential of the positive input of the comparator 30 is below the potential of the negative input, while a signal Z is outputted when it is above the same.

Figure 6:
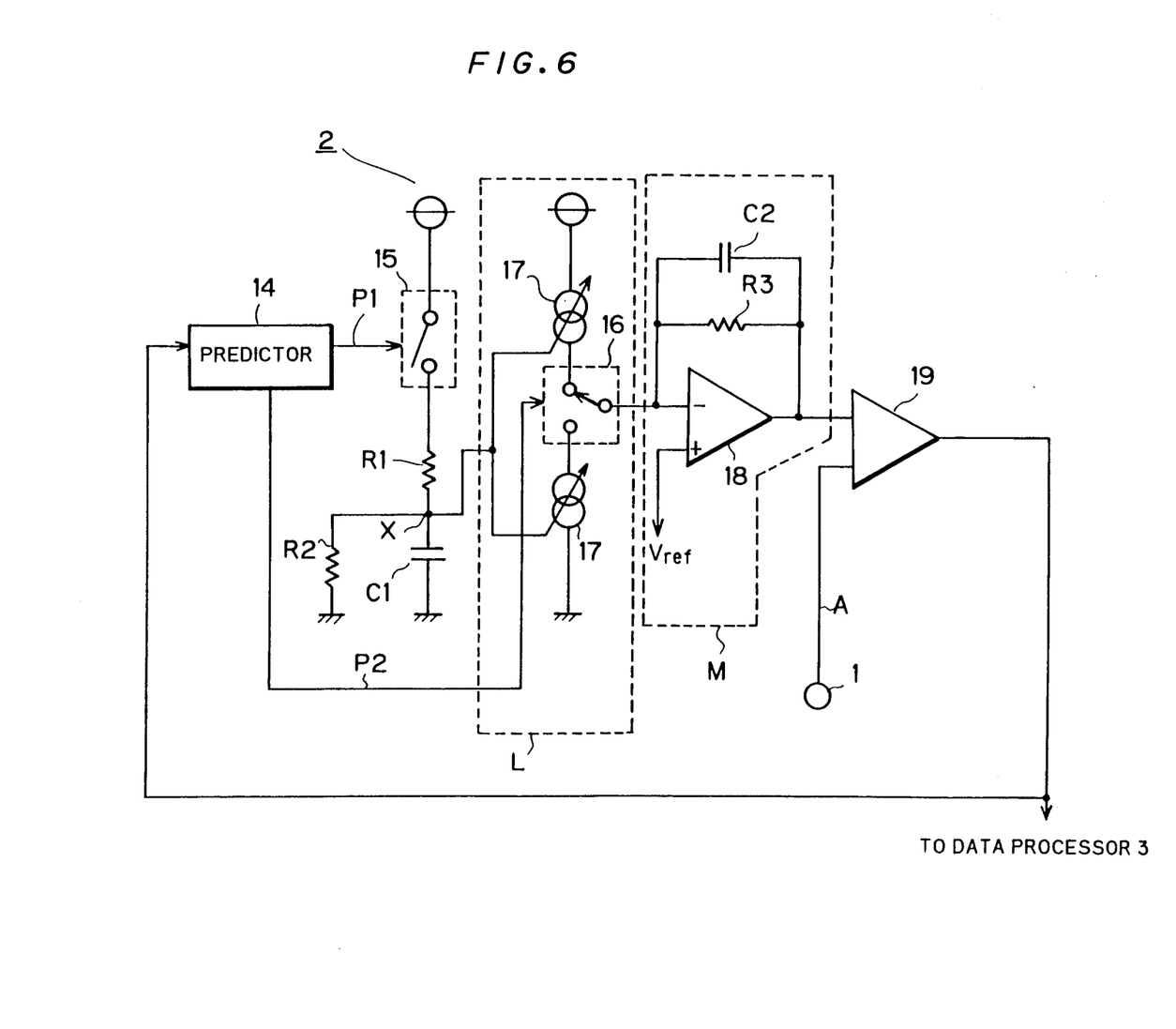
FIG. 6 is a circuit diagram showing exemplary structure of a current integration type adaptive delta modulator.

FIG. 6 is a circuit diagram showing exemplary structure of the current integration type adaptive delta modulator 2. Referring to FIG. 6, a predictor 14 judges whether or not an output signal from a comparator 19 is continuously at a high or low level by a prescribed number of times to output a digital signal P1, while outputting another digital signal P2 in response to the high or low level of the output signal from the comparator 19. A switch 15 is controlled by the signal P1. The switch 15 is connected in series with a resistor R1 and a capacitor C1. They are connected between a power source and a ground. A resistor R2, for discharging charges stored in the capacitor C1, is connected in parallel with the capacitor C1. The resistors R1 and R2 and the capacitor C1 are commonly connected with each other at a node X. A delta width adjusting circuit L is formed by a switch 16 and current sources 17. The switch 16 is switched in polarity in response to the signal P2. The current sources 17 are connected between an end of the switch 16 and the power source and between the other end and the ground, respectively. The current sources 17 are changed in amount of current in response to the potential of the node X. An integrator M is formed by an operational amplifier 18, a capacitor C2 and a resistor R3. The operational amplifier 18 is supplied with reference voltage $V_{ref}$ in its positive input. A parallel circuit of the capacitor C2 and the resistor R3 is connected between output and negative input of the operational amplifier 18. Output from the operational amplifier 18 is supplied to the comparator 19. The comparator 19 compares the analog signal A supplied from the analog signal input terminal 1 with output from the integrator M, to supply the result of comparison to the data processor 3 while feeding back the same to the predictor 14.

Figure 7:
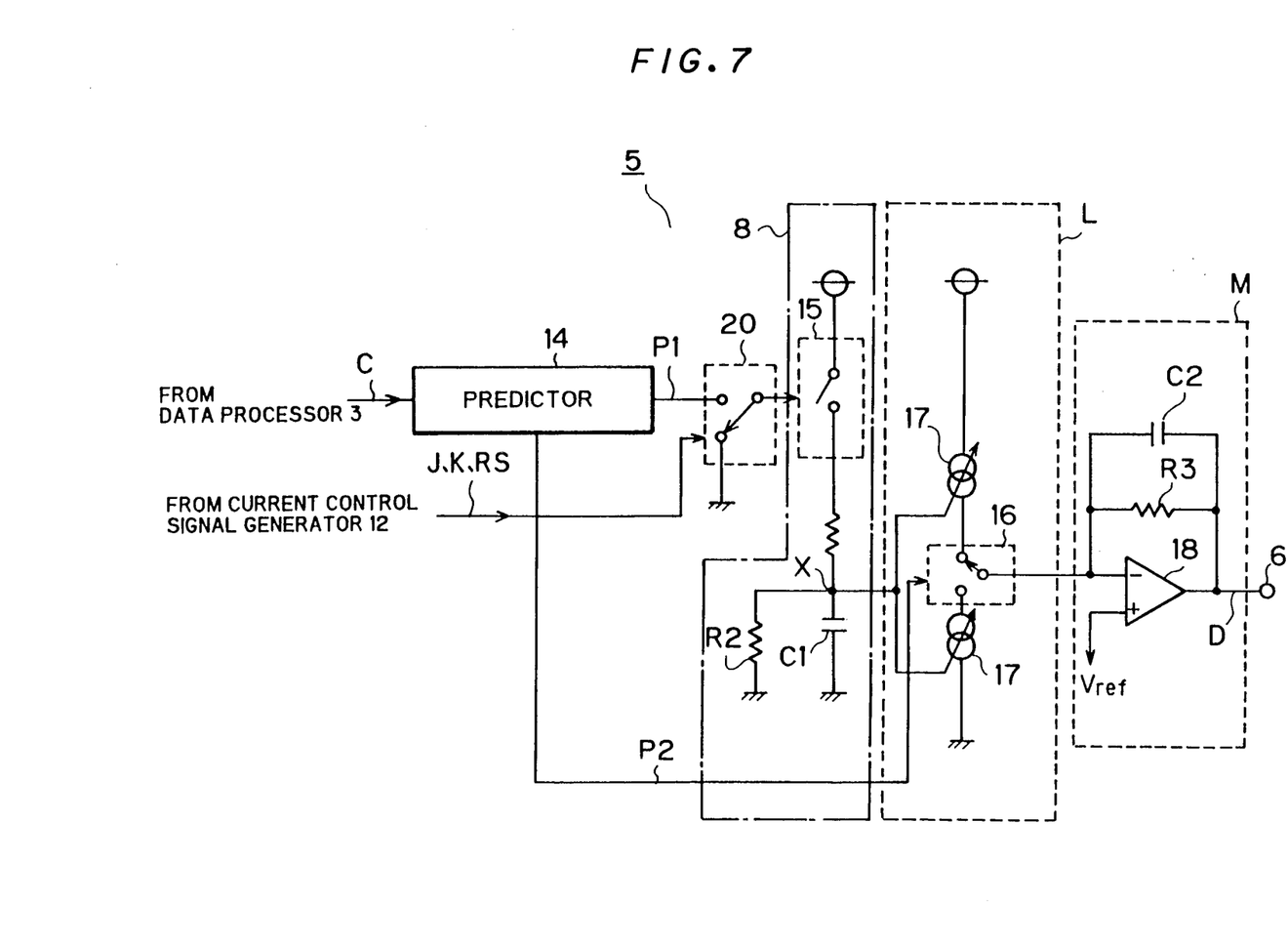
FIG. 7 is a circuit diagram showing a current integration type adaptive delta demodulator.

FIG. 7 is a circuit diagram showing exemplary structure of the current integration type adaptive delta demodulator 5. Referring to FIG. 7, the current integration type adaptive delta demodulator 5 includes a current control circuit 8. Most of the structure shown in FIG. 7 is similar to that of the current integration type adaptive delta modulator 2 shown in FIG. 6. Difference resides in that an additional switch 20 is provided between output of a predictor 14 and a switch 15 and that the comparator 19 is deleted. The switch 20 is supplied with the signal J or K from the current control signal generator 12. The switch 20 is switched to the output side of the predictor 14 or the ground side in response to the signal J or K, to attenuate the analog signal D outputted from the analog signal output terminal 6 or to release the attenuating action.

Figure 8:
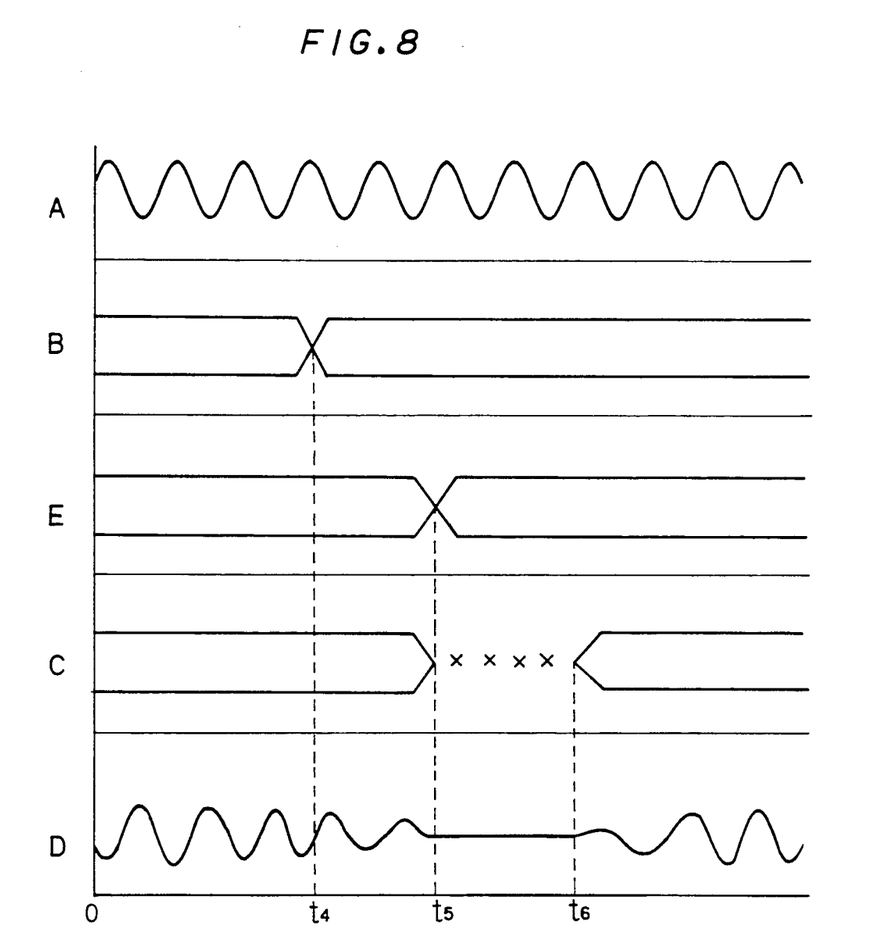
FIG. 8 and FIG. 9 are diagrams illustrative of operation of the apparatus shown in FIG. 4.
Figure 9:
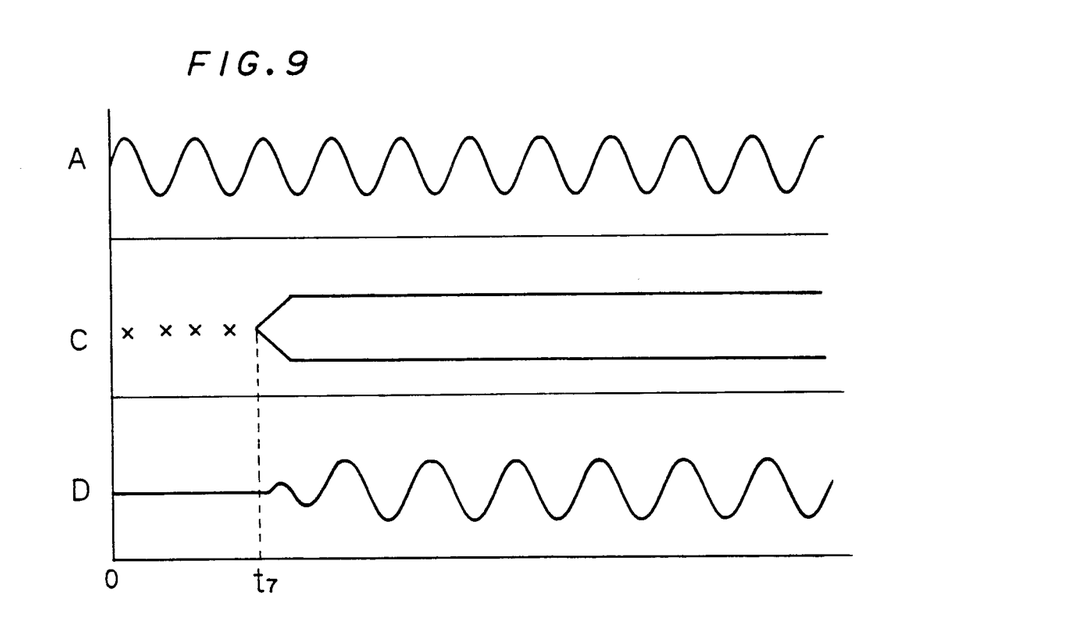

FIG. 8 and FIG. are diagrams illustrative of operations of the inventive signal processing apparatus. The operations will now be described with reference to FIG. 5 to FIG. 9. An analog signal A, which is inputted in the analog signal input terminal 1, is modulated into a digital signal by the current integration type adaptive delta modulator 2, the detail of which is shown in FIG. 6, as follows: The comparator 19 compares the analog signal A with output from the integrator M, to output the result. The predictor 14 judges whether or not the output from the comparator 19 is at a high level or a low level by a prescribed number of times, to generate a signal P1. The predictor 14 further generates a signal P2, which is in response to the high or low level of the output from the comparator 19. The switch 15 receives the signal P1, to be turned on when the signal P1 indicates continuation of the aforementioned prescribed number of times. Then, the capacitor C1 is charged through the resistor R1, whereby the potential at the node X is increased, to increase the current value of the current sources 17.

When the signal P1 does not indicate continuation of the prescribed number of times, on the other hand, the switch 15 is turned off. Then, charges in the capacitor C1 are discharged through the resistor R2, whereby the potential at the node X is gradually lowered to reduce the current value of the current sources 17.

The switch 16 is switched by the signal P2 in polarity, and current from the current sources 17 is inputted in the integrator M in response to the switched polarity. The output from the integrator M is compared with the analog signal A, the compative result is outputted as a digital signal. This digital signal is supplied to the data processor 3, while being fed back to the predictor 14. The digital signal inputted in the data processor 3 is subjected to delay processing for echo similarly to the conventional case, to be supplied to the current control circuit 8.

It is assumed that the data processing mode change command terminal 4 is supplied with a data processing mode change command B at a time t4. Then, the following operation is performed in the latch 7: The data processing mode change command B supplied from the data processing mode change command terminal 4 is latched by the latch 9 (see FIG. 5). On the other hand, the data processing mode change detector 10 supplies a change signal F to the counter 11A at the time t4. The counter 11A starts counting in response to the change signal F, while supplying a signal H to the current control signal generator 12. In response to the signal H, the current control signal generator 12 supplies an attenuation start signal J to the current control circuit 8. In response to the attenuation start signal J, the current control circuit 8 attenuates current supplied to the current integration type adaptive delta demodulator 5. Consequently, attenuation of an analog signal D outputted from the analog signal output terminal 6 is started from the time t4, as shown in FIG. 8. The counter 11A supplies a latch release Signal to the latch 9 when its counting reaches the first count number. The latch g is released from its latch state in response to the latch release signal G, and the data processing mode change command B is supplied to the data processor 3 as a delayed signal E at a time t5. The interval between the times t4 and t5 corresponds to the first count number of the counter 11A. The first count number is previously set in a stage of design to correspond to an interval from start of attenuation of the analog signal D, which is outputted from the current integration type adaptive delta demodulator 5, to completion of the attenuation.

In response to the delayed signal E of the data processing mode change command B, the data processor 3 changes the data processing mode at the time t5. Output data C from the data processor 3 are initially instable similarly to the conventional case, and stabilized at a time t6. The counter 11A reaches a second count number at the time t6, to supply a signal I1 to the current control signal generator 12. An analog signal D outputted from the analog signal output terminal 6 at the interval between the times t5 and t6 is in a completely attenuated state regardless of an input state of the analog signal A, and no noise is outputted dissimilarly to the conventional case. The current control signal generator 12 supplies an attenuation release signal K to the current control circuit 8 in response to the signal I1. In response to the attenuation release signal K, the current control circuit 8 releases attenuation of the current supplied to the current integration type adaptive delta demodulator 5. As a result, the analog signal D outputted from the analog signal output terminal 6 starts rising after the time t6. The interval between the times t4 and t6 corresponds to a second count number of the counter 11A, which is previously set in the stage of design by adding a time for stabilizing the data C, i.e., a count number corresponding to the interval between the times t5 and t6, to the aforementioned first count number. The time for stabilizing the data C can be decided from the working area of a memory and cycle time for writing/reading in/from the memory, in an analog signal delay system.

With reference to FIG. 7, operation f the attenuation of the output from the current integration type adaptive delta demodulator 5 and the release of such attenuation will now be described. As to the case of attenuating the output from the current integration type adaptive delta demodulator 5, the switch 20 is connected to a ground side upon supply of the attenuation start signal J. Then, the switch 15 is turned off and the capacitor C1 is discharged through the resistor R2, whereby the potential at the node X is gradually lowered and the amount of current in the current sources 17 is gradually reduced. Consequently, the output from the integrator M is attenuated.

As to the case of releasing attenuation of the current integration type adaptive delta demodulator 5, the switch 20 is connected to the predictor 14 side upon supply of the attenuation release signal K. Then, the switch 15 is turned on/off in response to the signal P1 and the capacitor C1 is gradually charged so that the potential at the node X is gradually increased and the amount of current in the current sources 17 is gradually increased. Consequently, the output from the integrator M is also gradually increased.

Figure 11:
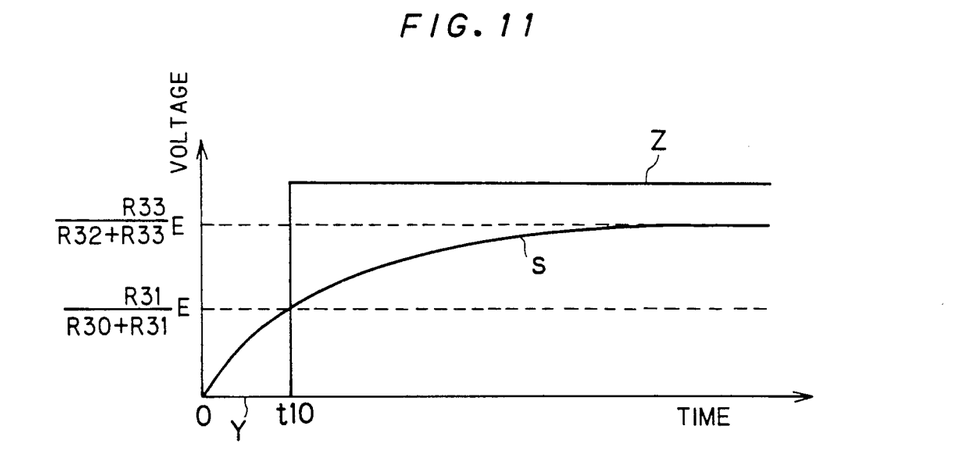
FIG. 11 is a diagram illustrative of operation of the circuit shown in FIG. 10.

According to the embodiment, no noise is outputted at the current integration type adaptive delta demodulator 5 in an initial state upon power supply. This will now be described with reference to FIG. 9 and FIG. It is assumed here that Output data C of the data processor 3 are instable in an interval between times 0 to t7 upon power supply. The comparator 30 outputs the signal y before the power source is turned on (i.e., when the switch 40 is in an OFF-state) and supplies the same to the current control signal generator 12. In response to the signal y, the current control signal generator 12 supplies the reset signal RS to the switch 20 shown in FIG. 7. In response to the reset signal RS, the switch 20 is connected to the ground side. Thus, the analog signal D is in a completely attenuated state. Upon turning on the power source (i.e., when the switch 40 is in an ON-state), a potential $\{R31/(R30+R31)\}$ E is applied to the negative input of the comparator 30. The capacitor 30 is connected to the positive input of the comparator 30, such that a time constant of the positive input of the comparator 30 is larger than the same of the negative input. Accordingly, the positive input of the comparator 30 gradually increases as shown by a solid line S in FIG. 11. The signal Z is then outputted by the comparator 30 only when the potential of the positive input of the comparator 30 becomes larger than the potential of the negative input (at time constant t10). An interval between 0 and a time t10 is assumed to be shorter than an interval between and a time t7. Similarly, recognized is to be the following relationship:

$$\frac{R31}{R30+R31} E < \frac{R33}{R32+R33} E$$

The counter 11B starts counting in response to the signal Z, to supply a signal I2 to the current control signal generator 12 upon counting by a number (third number) of counting corresponding to the interval between the times t10 to t7. In response to the signal I2, the current control signal generator 12 supplies an attenuation release signal K to the switch 20. The switch 20 is switched to the predictor 14 side in response to the attenuation release signal K, to perform normal operation. Thus, the analog signal D is in a completely attenuated state in the interval between the power supply and stabilization of the data C (between the times 0 and t7) as hereinabove described, whereby no noise is caused by instability of the data C, dissimilarly to the conventional case.

Although the above embodiment has been described with reference to such case that the current control circuit 8 is provided in the current integration type adaptive delta demodulator 5, the former may be provided separately from the latter.

In the above embodiment, the current supplied to the current integration type adaptive delta demodulator 5 is attenuated to thereby attenuate the analog signal D outputted from the current integration type adaptive delta demodulator 5, the former may be provided separately from the latter.

In the above embodiment, the current supplied to the current integration type adaptive delta demodulator 5 is attenuated to thereby attenuate the analog signal D outputted from the current integration type adaptive delta demodulator 5 in the aforementioned embodiment. Alternatively, the output from the current integration type adaptive delta demodulator 5 itself may be attenuated, to attain an effect similar to that of the above embodiment.

Further, the present invention is not restricted to current integration type adaptive delta converters but is also applicable to any signal processing apparatus which receives a first analog signal to convert the first analog signal into a digital signal by an A-D converter and performs prescribed processing on the digital signal and re-converts the processed digital signal into a second analog signal by a D-A converter to output the second analog signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A signal processing apparatus for receiving a first analog signal to convert the first analog signal into a digital signal, performing prescribed processing on said digital signal and re-converting the digital signal as processed into a second analog signal to output the second analog signal, comprising:
   an input terminal for receiving said first analog signal;
   an A-D converter connected to said input terminal for converting said first analog signal into a digital signal;
   a data processor connected to said A-D converter for performing prescribed processing on said digital signal from said A-D converter in a designated processing mode within a plurality of data processing modes to output a processed digital signal;
   a D-A converter for receiving said processed digital signal from said data processor to convert said processed digital signal into said second analog signal;

a data processing mode change command terminal for receiving a data processing mode change command for changing said data processing mode of said data processor; and control means connected to said data processor, said D-A converter and said data processing mode change command terminal for attenuating said second analog signal in response to said data processing mode change command from said data processing mode change command terminal while delaying said data processing mode change command by a first prescribed time to supply the command to said data processor and releasing attenuation of said second analog signal after a lapse of a second prescribed time being longer than said first prescribed time.

2. A signal processing apparatus in accordance with claim 1, wherein said digital signal has first and second levels, said A-D converter comprising a first predictor for outputting a first signal when said digital signal is continuously at said first or second level by a first prescribed number of times and a second signal when not, a first charging/discharging circuit connected to said first predictor, having a first capacitor which is charged in response to said first signal and discharged in response to said second signal, a first current adjustment circuit connected to said first charging/discharging circuit, for supplying a first output current which is varied in response to a charge voltage of said first capacitor.

a first integrator connected to said first current adjustment circuit, for integrating said first output current of said first current adjustment circuit, and a comparator having first and second input connected to said first integrator and said input terminal, respectively, and an output connected to said first predictor and said data processor, for comparing an output of said first integrator with said first analog signal to output said digital signal.

3. A signal processing apparatus in accordance with claim 2, wherein said first charging/discharging circuit comprises a first switch which has an input terminal connected to a second potential, an output terminal and a control terminal connected to said first predictor and is turned on in response to said first signal from said first predictor and turned off in response to said second signal from said first predictor, a first resistor having a first end connected to said output terminal of said first switch and a second end connected to a third potential through said first capacitor, and a second resistor connected between said second end of said first resistor and said third potential, for discharging said first capacitor.

4. A signal processing apparatus in accordance with claim 2, wherein said first predictor outputs a third signal and a fourth signal in response to said first and second levels of said digital signal, respectively, said first current adjustment circuit comprises a first current source having a first end connected to said third potential, a second end and a control terminal connected to said first capacitor, for supplying a current in response to said charge voltage of said first capacitor applied through said control terminal of said first current source, a second current source having a first end connected to said second potential, a second end and a control terminal connected to said first capacitor, for supplying a current in response to said charge voltage of said first capacitor applied through said control terminal of said second current source, and a second switch which has a first input terminal connected to said second end of said first current source, a second input terminal connected to said second end of said second current source, an output terminal connected to said first integrator and a control terminal connected to said first predictor and is so switched that said first input terminal is connected to said output terminal in response to said third signal from said first predictor and said second input terminal is connected to said output terminal in response to said fourth signal from said first predictor.

5. A signal processing apparatus in accordance with claim 2, wherein said first integrator comprises a first operational amplifier having a first input connected to a reference voltage source for applying a predetermined reference voltage, a second input connected to said first current adjustment circuit and an output connected to said first input of said comparator, a third capacitor connected between said second input and output of said first operational amplifier, and a third resistor connected in parallel with said third capacitor.

6. A signal processing apparatus in accordance with claim 1, wherein said control means comprises a command processing circuit connected to said data processing mode change command terminal and said data processor, for delaying said data processing mode change command by said first prescribed time to supply the command to said data processor, while outputting a first attenuation start signal in response to said data processing mode change command and a first attenuation release signal after a lapse of said second prescribed time, and a signal attenuation circuit connected to said data processor, said D-A converter and said command processing circuit, having an attenuation mode for attenuating said processed digital signal to supply said processed digital signal as attenuated to said D-A converter to thereby attenuate said second analog signal and a non-attenuation mode for not attenuating said processed digital signal to supply said processed digital signal as not attenuated to said D-A converter thereby not to attenuate said second analog signal, for entering said attenuation mode in response to said first attenuation start signal and said non-attenuation mode in response to said first attenuation release signal.

7. A signal processing apparatus in accordance with claim 6, wherein said processed digital signal has third and fourth levels, said D-A converter comprising a second predictor for outputting a fifth signal when said processed digital signal is continuously at said third or fourth level by a second prescribed number of times and a sixth signal when not, a second charging/discharging circuit coupled to said second predictor, having a second capacitor which is charged in response to said fifth signal and discharged in response to said sixth signal, a second current adjustment circuit connected to said second charging/discharging circuit, for supplying a second output current which is varied in response to a charge voltage of said second capacitor, and a second integrator connected to said second current adjustment circuit, for integrating said second output current of said second current adjustment circuit to output said second analog signal.

8. A signal processing apparatus in accordance with claim 7, wherein said signal attenuation circuit includes an attenuation switch having first and second input terminals connected to a first potential and said second predictor, respectively, an output terminal connected to said second charging/discharging circuit and a control terminal connected to said command processing circuit, said attenuation switch being so switched that said first input terminal is connected to said output terminal in response to said first attenuation start signal and said second input terminal is connected to said output terminal in response to said first attenuation release signal.

9. A signal processing apparatus in accordance with claim 8, wherein said command processing circuit comprises a data processing mode change detector connected to said data processing mode change command terminal, for outputting a change signal in response to said data processing mode change command, a first counter connected to said data processing mode change detector, for starting counting and outputting a count start signal in response to said change signal while outputting a first count finish signal after a lapse of said first prescribed time and a second count finish signal after a lapse of said second prescribed time, a latch connected to said data processing mode change command terminal and said first counter, for latching said data processing mode change command and outputting the command as latched in response to said first count finish signal, and a current control signal generator connected to said first counter, for outputting said first attenuation start signal in response to said count start signal and said first attenuation release signal in response to said second count finish signal.

10. A signal processing apparatus in accordance with claim 9, wherein said command processing circuit further comprises power supply confirmation circuit for detecting whether or not a power is supplied to output a non-making signal when the power is not supplied and a making signal when the power is supplied, and second counter connected to said power supply confirmation circuit, for starting counting in response to said making signal to output a third count finish signal after a lapse of a third prescribed time, said current control signal generator further being connected to said power supply confirmation circuit and said second counter, for outputting a second attenuation start signal in response to said non-making signal and a second attenuation release signal in response to said third count finish signal, said control terminal of said attenuation switch further being connected to said second current control signal generator, said attenuation switch so switched that said first input of said attenuation switch is connected to said output of said attenuation switch in response to said second attenuation start signal and said second input of said attenuation switch is connected to said output of said attenuation switch in response to said second attenuation release signal.

11. A signal processing apparatus in accordance with claim 7, wherein said second charging/discharging circuit comprises a third switch which has an input terminal connected to second potential, an output terminal and a control terminal connected to said second predictor and is turned on in response to said fifth signal from said second predictor and turned off in response to said sixth signal from said second predictor, a fourth resistor having a first end connected to said output terminal of said third switch and a second end connected to a third potential through said second capacitor, and a fifth resistor connected between said second end of said fourth resistor and said third potential, for discharging said second capacitor.

12. A signal processing apparatus in accordance with claim 7, wherein said second predictor outputs a seventh signal and an eighth signal in response to said third and fourth levels of said processed digital signal, respectively, said second current adjustment circuit comprises a third current source having a first end connected to said third potential, a second end and a control terminal connected to said second capacitor, for supplying a current in response to said charge voltage of said second capacitor applied through said control terminal of said third current source, a fourth current source having a first end connected to said second potential, a second end and a control terminal connected to said second capacitor, for supplying a current in response to said charge voltage of said second capacitor applied through said control terminal of said fourth current source, and a fourth switch which has a first input terminal connected to said second end of said third current source, a second input terminal connected to said second end of said fourth current source, an output terminal connected to said second integrator and a control terminal connected to said second predictor and is so switched that said first input terminal is connected to said output terminal in response to said seventh signal from said second predictor and said second input terminal is connected to said output terminal in response to said eighth signal from said second predictor.

13. A signal processing apparatus in accordance with claim 7, wherein said second integrator comprises a second operational amplifier having a first input connected to a reference voltage source for applying a predetermined reference voltage, a second input connected to said second current adjustment circuit and an output through which said second analog signal is outputted, a fourth capacitor connected between said second input and output of said second operational amplifier, and a sixth resistor connected in parallel with said fourth capacitor.

* * * * *